(12) United States Patent
Pasqualetto et al.

(10) Patent No.: US 9,880,229 B2
(45) Date of Patent: Jan. 30, 2018

(54) MEASUREMENT OF BONDING RESISTANCES

(71) Applicants: CONTINENTAL AUTOMOTIVE FRANCE, Toulouse (FR); CONTINENTAL AUTOMOTIVE GmbH, Hannover (DE)

(72) Inventors: Angelo Pasqualetto, Toulouse (FR); Jean-Marie Quintin, Tournefeuille (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 34 days.

(21) Appl. No.: 14/585,479

(22) Filed: Dec. 30, 2014

(65) Prior Publication Data
US 2015/0198642 A1 Jul. 16, 2015

(30) Foreign Application Priority Data
Jan. 10, 2014 (FR) ..................................... 14 50163

(51) Int. Cl.
*G01R 27/02* (2006.01)
*G01R 31/40* (2014.01)
*G01R 27/20* (2006.01)

(52) U.S. Cl.
CPC ............ *G01R 31/40* (2013.01); *G01R 27/205* (2013.01)

(58) Field of Classification Search
CPC G01R 27/02; G01R 31/2621; G01R 31/2601; G01R 31/2608; G01R 31/025; G01R 31/2884; H03K 17/56

(Continued)

(56) References Cited

U.S. PATENT DOCUMENTS 6,259,035 B1 * 7/2001 Truggelmann ............ C23C 2/04
174/250
2005/0040867 A1 * 2/2005 Haq .................... G06F 13/4086
327/112

(Continued)

FOREIGN PATENT DOCUMENTS

EP             1495944 A1 *  1/2005  ............. B62D 5/049

OTHER PUBLICATIONS

French Search Report, dated Sep. 25, 2014, from corresponding FR application.

*Primary Examiner* — Patrick Assouad
*Assistant Examiner* — Taqi Nasir
(74) *Attorney, Agent, or Firm* — Young & Thompson

(57) ABSTRACT

Disclosed is a method for determining a contact resistance of an H bridge including four transistors, each transistor having a point of connection to two neighboring transistors, a bond being produced in each case between a connection point lying between two transistors and an access terminal. The method includes: acting on the open/closed state of the transistors of the bridge so that the transistors on either side of the connection point corresponding to the access terminal are open; applying a determined voltage to an access terminal; determining the current flowing through the bond corresponding to the access terminal; grounding an access terminal neighboring the access terminal if this neighboring access terminal is not already connected to ground; and measuring the voltage at the other neighboring access terminal.

4 Claims, 9 Drawing Sheets

(58) Field of Classification Search
USPC .......... 324/691, 421, 525, 549, 727, 760.02,
324/762.08, 762.09, 768, 769; 327/424,
327/110, 112, 423
See application file for complete search history.

(56) References Cited

U.S. PATENT DOCUMENTS

| | | | |
|---|---|---|---|
| 2005/0104614 A1* | 5/2005 | Sakaguchi ......... | G01R 31/2621 324/762.09 |
| 2007/0080697 A1* | 4/2007 | Tseng .................. | G01R 27/205 324/691 |
| 2008/0204068 A1* | 8/2008 | Dahlstrom ......... | G01R 31/2894 324/762.08 |
| 2008/0270064 A1* | 10/2008 | Bhushan .......... | G01R 31/31722 702/119 |
| 2008/0278174 A1* | 11/2008 | Li ........................ | B60L 3/0023 324/525 |
| 2015/0168484 A1* | 6/2015 | Ratz .................. | G01R 31/2608 327/109 |

* cited by examiner

|  | HS1 | HS2 | LS1 | LS2 | c.f. |
|---|---|---|---|---|---|
| F | ON | OFF | OFF | ON | Figure 2a |
| R | OFF | ON | ON | OFF | Figure 2b |
| RL LS active | OFF | OFF | ON | ON | Figure 2c |
| RL HS active | ON | ON | OFF | OFF | Figure 2f |
| RL LS passive | OFF | OFF | ON | OFF | Figure 2e |
| RL LS passive | OFF | OFF | OFF | ON | Figure 2d |
| RL HS passive | ON | OFF | OFF | OFF | Figure 2h |
| RL HS passive | OFF | ON | OFF | OFF | Figure 2g |
| Haute impédance | OFF | OFF | OFF | OFF |  |

Figure 5

|  | A | C | E | K | HS1 | Td | HS2 | Tf | LS1 | LS2 | c.f. |
|---|---|---|---|---|---|---|---|---|---|---|---|
| Rab | +1V; Vp | Vm | GND |  | ON |  | ON |  | OFF | OFF | Fig.7a |
| Rab | +5V; Vp | Vm | 0,4 Ω + GND |  | ON |  | ON |  | OFF | OFF | Fig.7b |
| Rab | +1V; Vp | GND | Vm |  | ON |  | ON |  | OFF | OFF | Fig.8a |
| Rab | +5V; Vp | 0,4 Ω + GND | Vm |  | ON |  | ON |  | OFF | OFF | Fig.8b |
| Ref | Vm | X | +1V; Vm |  | OFF |  | ON |  | OFF | ON | Fig.9a |
| Ref | Vm | X | +1V; Vm |  |  | OFF |  | ON | OFF | ON | Fig.9b |
| Ref | X | X | +1V; Vp | Vm | OFF |  | OFF |  | ON | ON | Fig.9c |
| Rcd | Vm | +1V; Vp | X |  | OFF |  | ON |  | OFF | ON | Fig.10a |
| Rcd | Vm | +1V; Vp | X |  |  | ON |  | OFF | ON | OFF | Fig.10b |
| Rcd | X | +1V; Vp | X | Vm |  | ON |  | OFF | ON | OFF | Fig.10c |
| Rgh | X | +1V | Vp |  | OFF |  | OFF |  | ON | ON | Fig.11 |
| Rgh | X | Vp | +1V |  | OFF |  | OFF |  | ON | ON | Fig.12 |
| Rgh,Rcd | Vpa | +1V | Vpe |  | ON |  | OFF |  | ON | ON | Fig.13 |
| Rgh,Rcd | Vpa | Vpc | +1V |  | OFF |  | ON |  | ON | ON | Fig.14 |

Figure 6

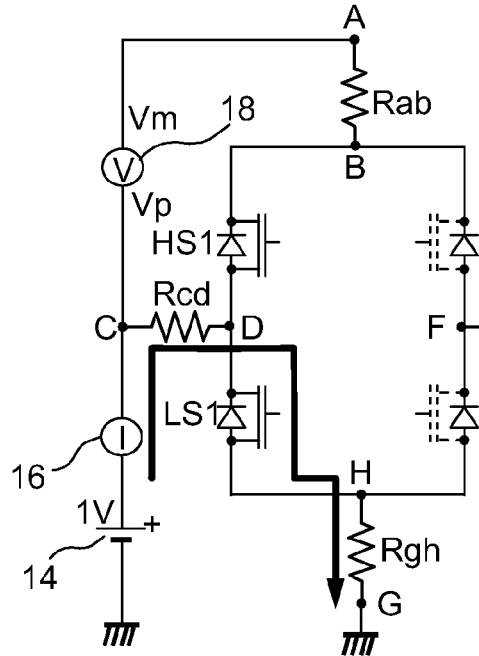
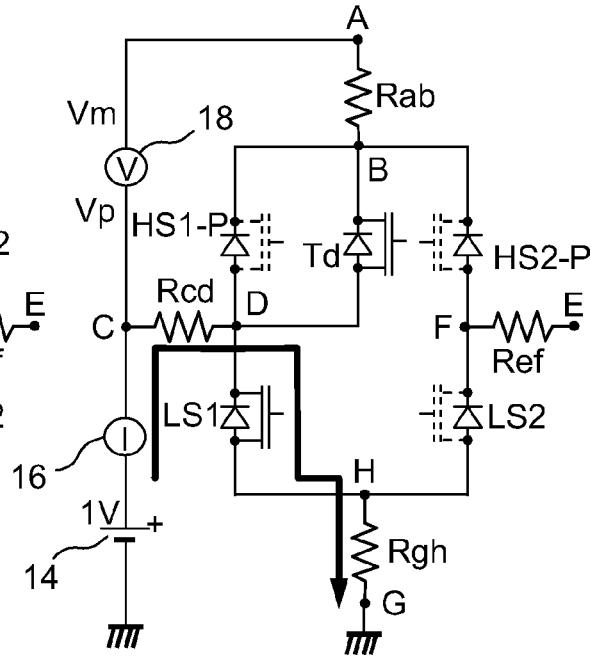
Figure 10a
Figure 10b
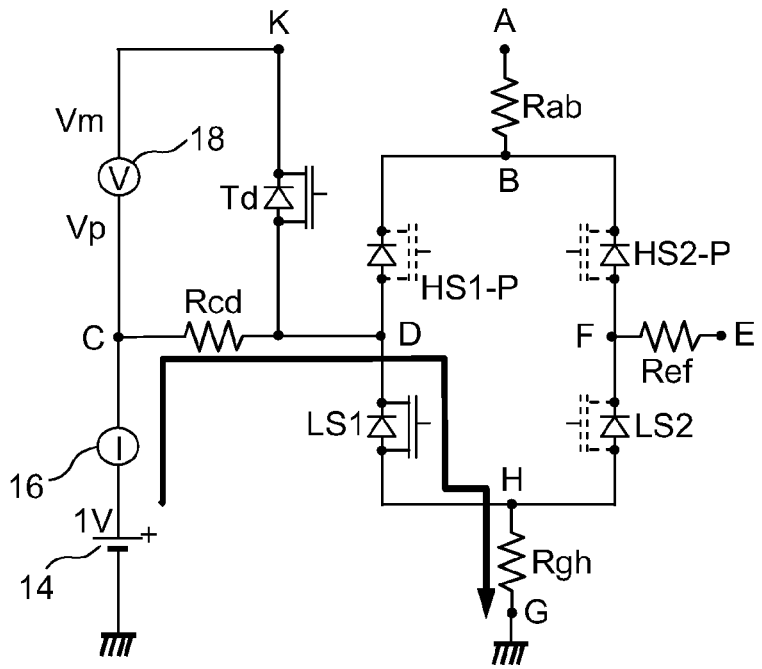
Figure 10c

MEASUREMENT OF BONDING RESISTANCES

BACKGROUND OF THE INVENTION

Field of the Invention

The present invention relates in general to the supply of inductive loads, and more especially to the measurement and detection of one or more anomalies in the bonding resistances of a switching structure such as a transistor bridge, for example, adapted to drive a current of determined value in an inductive load.

Description of the Related Art

The invention finds applications particularly in the field of automobiles. It may be used, for example, to control switching connectivity structure(s) such as an H bridge. Such structures are used to control the direction and/or strength of the electric current in inductive loads, for example electric motors. These motors may be used in electronic control systems of an actuator, such as an electronic throttle control (ETC), or more generally any other equipment actuated by an electric motor, such as a power window.

FIG. 1 schematically illustrates control of an inductive load 10 (electric motor or the like) taking place in a known manner with the aid of a switching structure 2 (of the H bridge type). Such a switching structure 2 comprises in particular four power switches HS1, HS2, LS1 and LS2, each switch being formed in general by an MOS (Metal Oxide Semiconductor) power transistor. These four transistors are managed in a "control" layer of the system, coming above a "component" layer consisting of the electronic components per se of the H bridge. A sequence of control signals for each of the transistors is produced according to a determined strategy, for example on the basis of a setpoint control signal. This strategy causes the H bridge to be controlled in certain determined configurations with the aid of sets of controls leaving certain combinations or certain sets of controls unused.

The components which constitute the control structure of the H bridge are generally integrated into packages referred to as integrated circuits. Such circuits are designed with the aid of design and assembly techniques derived from microelectronics. With a view to increasing performance and reducing costs, integrated circuits in general, and in particular integrated circuits intended for the automobile industry, are faced with a constant need to reduce their size and increase their integration and their performance, which may sometimes cause problems of overheating in the circuits.

One source of heating in an integrated circuit, such as an H bridge 2 illustrated in FIG. 1, is the connection of this circuit to terminals for access to the circuit, for example in order to supply it with electricity and connect it to the corresponding load. In the case illustrated in FIG. 1, the transistors HS1, HS2, LS1 and LS2 are connected on the one hand to a battery 3 delivering a voltage Vbat and to a reference voltage such as a ground GND, and on the other hand to the inductive load 10. In each case, a connection referred to as a bond 6 is produced between a point of connection 4 between two transistors and a terminal 8 for access to the H bridge 2. These bonds 6 introduce resistances into the circuit, which then release heat by the Joule effect during the operation of the circuit.

A plurality of connection techniques are possible and are well known to the person skilled in the art, for example the technique of connection with the aid of conductive wires called wire bonding, using metal wires to connect the various components. In order to optimize the bonds between the various elements and/or make them more reliable, it is possible to use a plurality of connection wires, which are then connected in parallel.

During the control of a motor, for example, predetermined combinations activate certain pairs of control transistors of the H bridge 2 and cause currents of varying strength to flow through the corresponding connection wires, which may generate overheating due to the passage of a strong current. This overheating causes a localized increase in the temperature, principally at the connection wires, and generates a relatively large variation in the internal resistance of the connection wires in question, in certain cases causing them to break.

If a connection wire is poorly connected, the overall resistance of the corresponding bond, also referred to as a contact resistance, is affected. Ideally, good connection of each connection wire should be checked, for example by measuring the corresponding contact resistance. It is necessary to be able to test the bonds separately and independently, in order to identify whether at least one wire is defective.

The bonding resistances may be estimated theoretically on the basis of knowledge of the length (maximum value for the worst case) and the diameter (minimum value for the worst case) of the wires used, the material used being known. The maximum theoretical value may be used as a comparison reference for the measurement.

SUMMARY OF THE INVENTION

It is an object of the present invention to provide means for determining whether all the internal connections are correctly produced by measuring the contact resistance at a bond of an H bridge.

To this end, the present invention provides a method for determining a contact resistance of an H bridge comprising four transistors arranged in an H, each transistor having a point of connection to two neighboring transistors, a bond being produced in each case between a connection point lying between two transistors and an access terminal.

According to the invention, this method comprises the following steps:
  acting on the open/closed state of the transistors of the H bridge so that the transistors on either side of the connection point corresponding to the access terminal are closed,
  applying a determined voltage to an access terminal,
  determining the current flowing through the bond corresponding to said access terminal,
  grounding an access terminal neighboring said access terminal if this neighboring access terminal is not already connected to ground, and
  measuring the voltage at the other neighboring access terminal.

In order to carry out this method, the voltage applied to the access terminal is advantageously less than the control voltage of each of the transistors. It may lie between 0.5 V and 5 V.

The present invention also relates to a device for determining a contact resistance of an H bridge comprising four transistors arranged in an H, each transistor having a point of connection to two neighboring transistors, a bond being produced in each case between a connection point lying between two transistors and an access terminal.

According to the present invention, this device comprises:
  means for applying a determined supply voltage to an access terminal, means for determining the current flowing through the bond corresponding to said access terminal, means for measuring the voltage between two access terminals, and control means for acting on the open/closed state of the transistors of the H bridge.

The means presented here in the proposed configuration make it possible, by selecting the appropriate state for the transistors, to measure on the one hand the current passing through the contact resistance that is intended to be determined, and on the other hand the potential difference across its terminals. A simple calculation (by division) then makes it possible to determine the desired resistance value.

In one embodiment of the invention, the voltage applied to one of the two access terminals is advantageously less than the voltage used operationally.

The voltage applied to the access terminal may, for example, lie between 0.5 V and 5 V.

In an H bridge, one of the access terminals is connected to ground. In order to be able to determine, in one measurement, the value of the contact resistance corresponding to this access terminal and that of a contact resistance corresponding to a neighboring access terminal, the device according to the invention comprises a single access terminal connected to ground, and advantageously means for measuring the voltage at the access terminal opposite the access terminal connected to ground. This device therefore comprises two separate voltage measurement means (voltmeters).

BRIEF DESCRIPTION OF THE DRAWINGS

Other characteristics and advantages of the invention will become more apparent on reading the following description. This description is purely illustrative and is provided with reference to the appended drawing, in which:

FIG. 5 is a table indicating the characteristics of various operational states of an H bridge, which contains the operating states used in FIGS. 2a to 2h, FIG. 6 is a table illustrating the controls of the transistors of an H bridge for carrying out the present invention, and FIGS. 7a to 14 illustrate the implementation of the controls of the table in FIG. 6.

DETAILED DESCRIPTION OF THE PREFERRED EMBODIMENT

Figure 1:
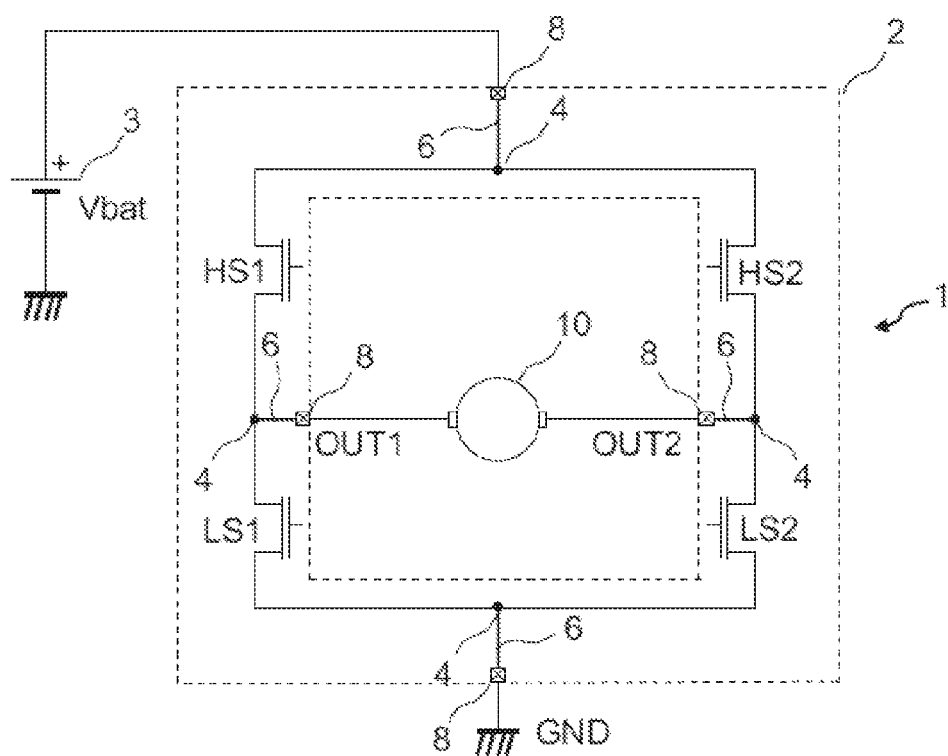
FIG. 1 is a functional diagram illustrating an H bridge and a controlled inductive load.

Referring to FIG. 1, a device for controlling an inductive load 1 comprises a switching structure of the "H bridge" type. Such a switching structure comprises four power switches, each formed by a power MOS transistor in the embodiment illustrated. The subsequent figures present an example of the connectivity connecting the H bridge to an electric motor 10.

A first transistor HS1 is connected between, on the one hand, a positive supply terminal to which the voltage Vbat of a battery 3 is applied, and on the other hand a first terminal OUT1 of the motor 10.

A second transistor LS1 is connected between, on the one hand, said first terminal OUT1 of the motor 10 and, on the other hand, a terminal to which a reference potential is applied, here a ground GND.

A third transistor LS2 is connected between, on the one hand, a second terminal OUT2 of the motor 10 and, on the other hand, the ground GND.

Lastly, a fourth transistor HS2 is connected between, on the one hand, the battery 3 at its positive supply terminal Vbat and, on the other hand, the second terminal OUT2 of the motor 10.

The transistors HS1 and HS2 are referred to as high-side transistors, and the transistors LS1 and LS2 are referred to as low-side transistors. The H bridge may be controlled according to a plurality of states.

Figure 2A:
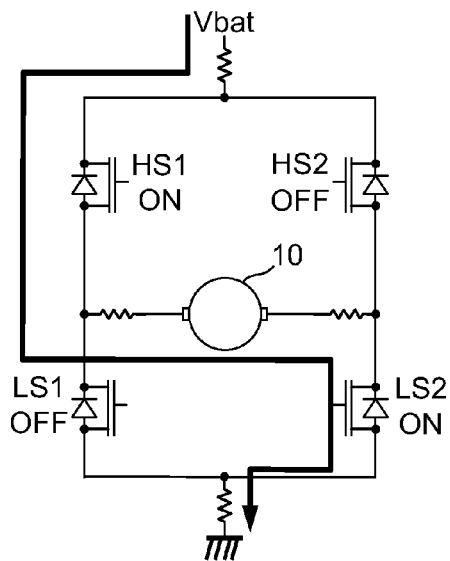
FIGS. 2a to 2h are diagrams illustrating the operational modes of controlling an inductive load.

In a first state, the pair formed by the high-side transistor HS1 and the low-side transistor LS2 makes it possible, when these transistors are on (switches closed), to make a current flow through the motor 10 in a first direction, as indicated by an arrow in FIG. 2a. The transistors HS2 and LS1 are then off (switches open). This state is referred to as F (for forward).

Figure 2B:
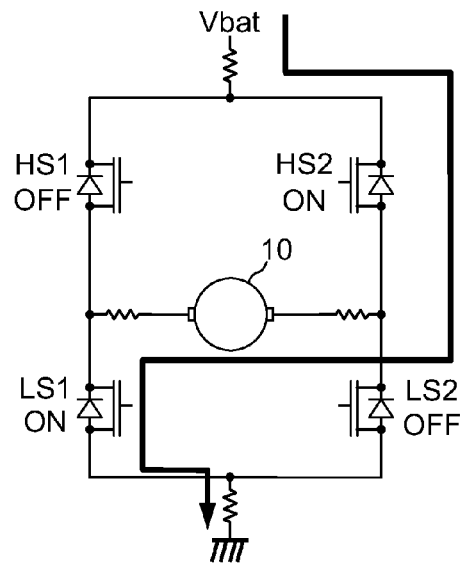

In a second state, the pair formed by the low-side transistor LS1 and the high-side transistor HS2 makes it possible, when these transistors are on (switches closed), to make a current flow through the motor 10 in the other direction, as indicated by the arrow in FIG. 2b. The transistors HS1 and LS2 are then off (switches open). This state is referred to as R (for reverse).

Figure 2C:
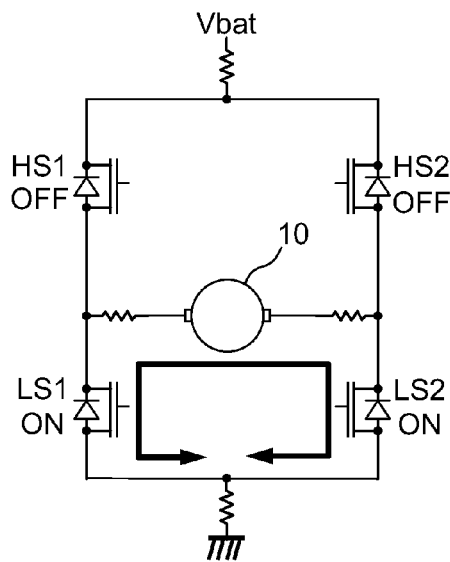
Figure 2F:
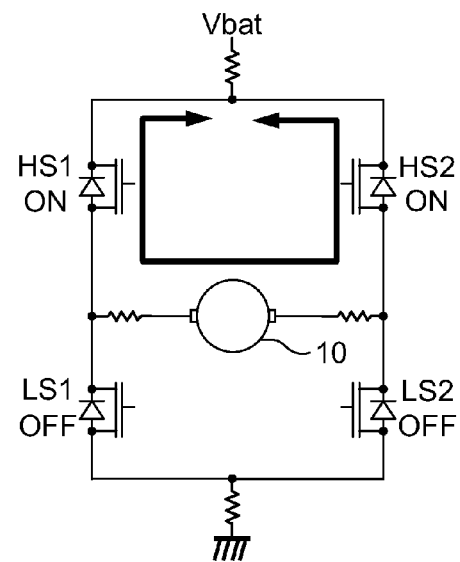
Figure 2D:
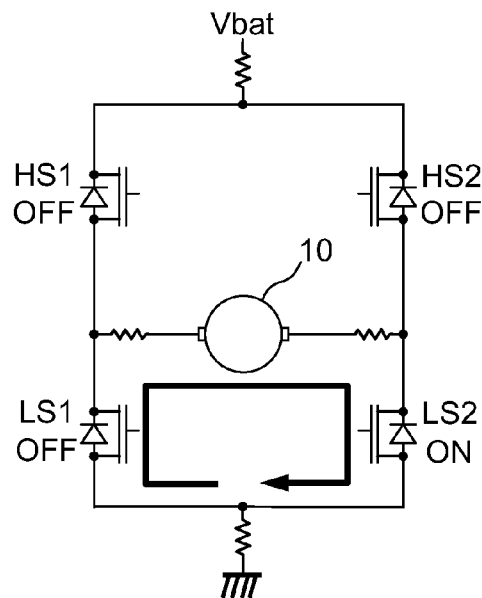
Figure 2G:
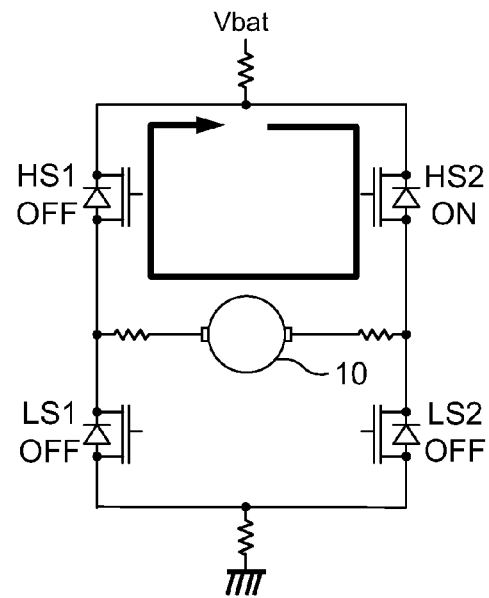
Figure 2E:
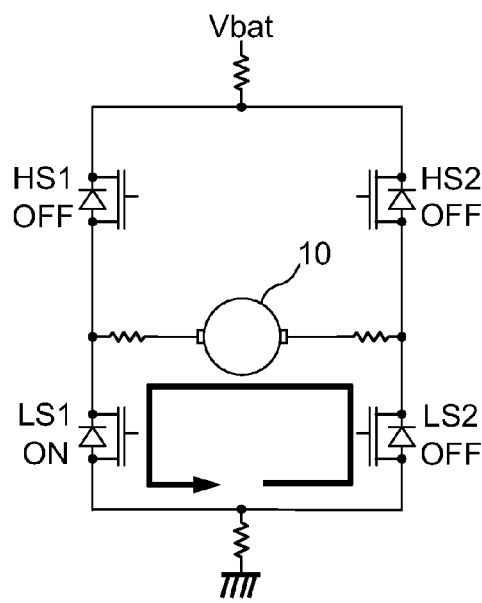
Figure 2H:
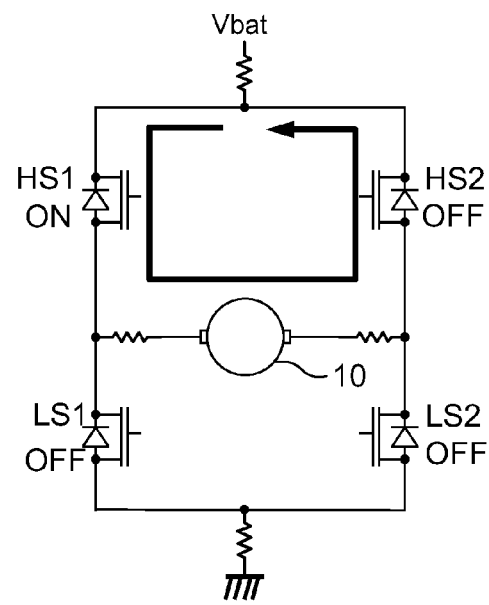

Lastly, two other states illustrated in FIGS. 2c and 2f correspond to two states referred to as freewheel or FW. When the high-side transistors HS1 and HS2 are off (switches open) and the low-side transistors LS1 and LS2 are on (switches closed), the corresponding freewheel state is referred to as low-side freewheel (or LS FW) and, conversely, when the high-side transistors HS1 and HS2 are on (switches closed) and the low-side transistors LS1 and LS2 are off (switches open), this corresponds to a high-side freewheel state (or HS FW).

The freewheeling may also take place with only one of the four MOS closed, depending on the direction of the current, as presented in FIGS. 2d, 2e, 2g and 2h.

The H bridge, or more precisely the components constituting the structure of the H bridge, for example the MOS transistors mentioned above, are generally integrated in a package, or more commonly referred to as an integrated circuit, which has been fabricated with the aid of the design and assembly techniques of microelectronics. In order to extend the connectivity of the integrated circuit outward, it is necessary to connect said integrated circuit to external elements, as explained in the preamble with reference to FIG. 1.

In order to do this, a plurality of connection techniques are possible, these being well known to the person skilled in the art, for example the technique of connection with the aid of conductive wires called wire bonding. These wires make it possible to connect the integrated circuit to terminals of external elements. In order to optimize the bonding between the integrated circuit and the external elements, a plurality of connection wires are commonly used, said wires then being placed in parallel between the integrated circuit and the corresponding external element, on the same contact location at each of the ends of the connection wires.

The presence of these connection wires (also commonly referred to as bonding wires) leads to the occurrence, inter alia, of resistances referred to as contact resistances. These contact resistances vary as a function of, on the one hand, the nature of the metal used to produce the connection wires and, on the other hand, the geometry and the number of the connection wires used.

Figure 3:
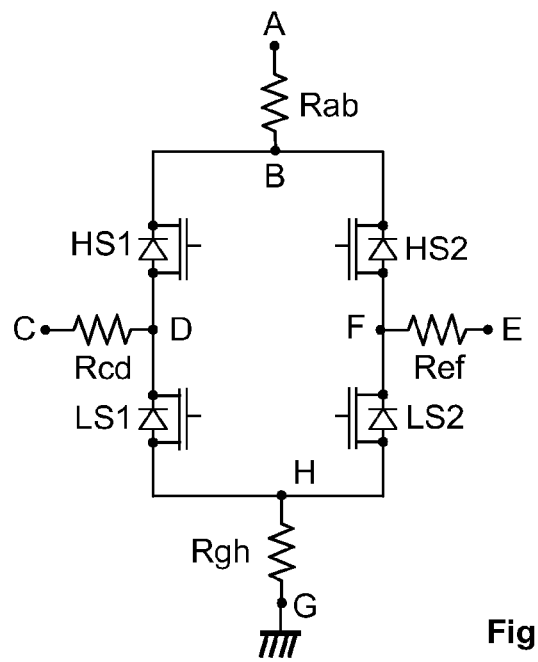
FIG. 3 illustrates the contact resistances of a connected H bridge.

FIG. 3 schematically represents the equivalent contact resistances for the connection of an H bridge. In FIG. 3, in comparison with FIG. 1, the connection points 4 (FIG. 1) have been referenced with the letters B, D, F and H (FIG. 3), while the access terminals 8 (FIG. 1) have been referenced with the letters A, C, E and G (FIG. 3).

A first resistance Rab corresponds to the connection wire(s) connecting the connection point B between the transistors HS1 and HS2 to the access terminal A, which is itself connected to the positive terminal of the battery 3 during operational use of the H bridge.

A second contact resistance Rgh corresponds to the connection wire(s) connecting, on the one hand, the connection point H of the transistors LS1 and LS2 and, on the other hand, a terminal denoted G for connection to ground GND.

A third contact resistance Rcd corresponds to the connection wire(s) connecting, on the one hand, the connection point D of the transistors HS1 and LS1 and, on the other hand, a point C corresponding to an output pin of the H bridge, intended to be connected to the terminal OUT1 of the motor 10.

A fourth contact resistance Ref corresponds to the connection wire(s) connecting, on the one hand, the connection point F of the transistors HS2 and LS2 and, on the other hand, a point E corresponding to an output pin of the H bridge, intended to be connected to the terminal OUT2 of the motor 10.

In order to measure the contact resistances separately, it is proposed to switch the four transistors of the H bridge into open or closed states according to a strategy specific to the measurement. This strategy necessarily involves control combinations different from those used when controlling the inductive load. FIG. 5 presents a table of combinations which may be used during the control of the inductive load. Thus, the measurement of the resistances Rcd and Ref cannot be carried out on the basis of the combinations presented in FIG. 5, because they would involve connections that would lead to unacceptable short circuits in the operational mode. FIG. 6 presents a table of combinations making it possible to measure the resistances Rcd and Ref.

Figure 4:
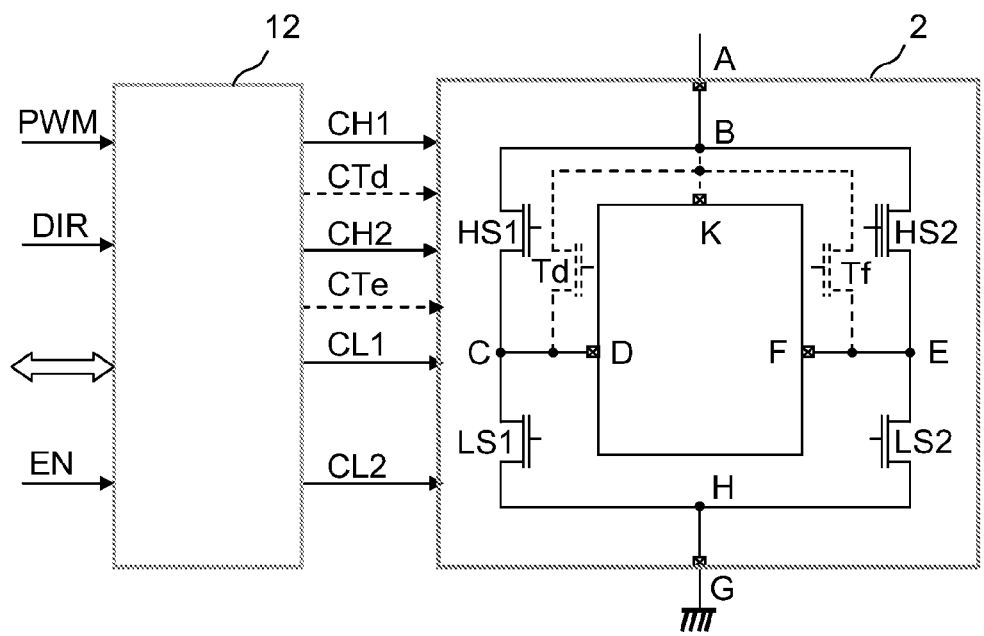
FIG. 4 is a functional diagram for the implementation of the present invention.

This strategy, using inter alia the combinations presented in FIG. 6, may be used with a structure such as that represented in FIG. 4. A control unit 12 makes it possible, as a function of digital signals through a digital connection, no longer to be controlled by PWM and DIR signals. Thus, the control unit 12 may establish a control set CH1 (for HS1), a control set CTd when a transistor Td is coupled between point D and point B, a control set CH2 (for HS2), a control set CTe when a transistor Tf is coupled between point E and point B, a control set CL1 (for LS1) and a control set CL2 (for LS2) as a function of the code received. It is expedient to safeguard entry into this mode so that the combinations are not possible under the effect of a simple parasite during the operational mode.

The high-side transistors (HS1 and HS2) may, depending on the technology used, impose conditions regarding the voltage to be applied to terminal A. In the case of P-type MOS transistors, for example, it is necessary for this voltage applied to the source to be sufficient so that the voltage VGS can reach at least 3 V. In this case, it may be necessary to insert a resistance on the ground side in order to limit the current. The use of N-type MOS transistors does not impose such a constraint, so long as at least 5 V are applied directly to the output of the charge pump (in a design targeted at the operational mode, the charge pump is not effective at low voltage).

Some figures represent cases in which the high-side transistors are of the P type. In this case, the P type is mentioned in the figure by a suffix "-P" after the name of the transistor in question. When there is no mention of this type, the transistor is an N-type MOS transistor.

If the total resistance is 100 mΩ (including the contact and wiring resistances), then a current of 10 A is injected. If the contact resistance to be measured is of the order of 10 mΩ, then it is necessary to measure a voltage of the order of 100 mV with a voltmeter 18.

The characterization of the resistance Rab is described in detail first. The characterization of the other resistances will then be described more briefly.

Figure 7A:
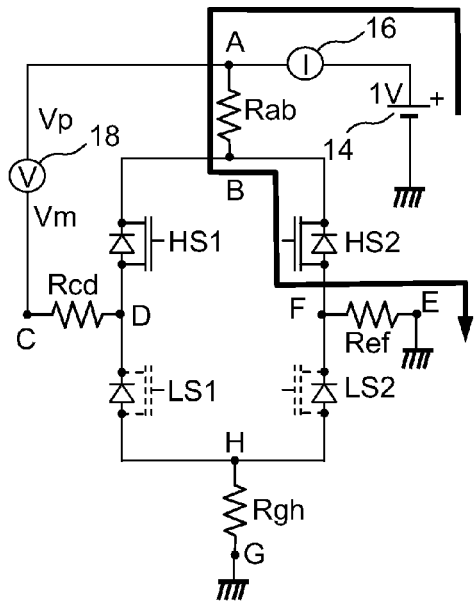

A stabilized supply 14 is connected to an access terminal A, and an ammeter 16 in series with the contact resistance Rab measures the current I flowing through it, as presented in FIG. 7a.

An access terminal neighboring the access terminal A of the H bridge is connected to ground. In the embodiment of FIG. 7, the access terminal E is thus connected to ground. The other neighboring access terminal C is connected to an input pin denoted Vm (cold point) of a voltmeter 18 capable of measuring an electric voltage V corresponding to the potential difference between the access terminals A and C. The other terminal Vp (hot point) of the voltmeter 18 is connected to the access terminal A. The hot point Vp is a point at a higher potential than the cold point Vm.

In order to characterize the contact resistance Rab, for example, it is necessary here for the transistors HS1 and HS2 (FIGS. 6 and 7a) to be in the "ON" position, a position corresponding to a switched or conducting state. The transistors LS1 and LS2 are for their part in the "OFF" position, i.e. in an open or blocked position. FIG. 7a therefore represents these transistors in dotted lines.

The table of FIG. 6 contains the various switching sets for the transistors HS1, HS2, LS1 and LS2, making it possible to characterize the contact resistances Rab, Rcd, Ref and Rgh.

The potential applied to the access terminal A by the stabilized supply 14, as described above, may for example be of the order of 1 V. It will be as constant as possible, and its value will for example lie between 0.5 V and 5 V.

The potential measured at point C is in fact substantially identical to the potential of point B. This is because, owing to the "ON" or conducting state of the transistor HS1, the voltage drop across the terminals of the transistor HS1 is negligible. Furthermore, the resistance of the voltmeter 18 is very high compared with all the resistances of the circuit, so that an extremely small current flows through the transistor HS1 and through the contact resistance Rcd. Thus, the potentials at B and at C may be considered to be equal. The electric current flowing through the resistance Rab to be characterized is measured by the ammeter 16. Said value of the resistance to be characterized is then equal to:

$$Rab = V/I \qquad (\text{Eq. 1})$$

V being the value of the voltage measured by the voltmeter 18 at point C, and

I being the value of the current, measured by the ammeter 16, flowing through the resistance Rab to be characterized.

The value of the contact resistance Rab depends inter alia on the nature of the metal used to make the connection wires used to produce the corresponding bond. Assuming that all the connection wires in a given bond are similar, the corresponding contact resistance then depends above all on the number of connection wires between the connection point of the H bridge and the access terminal. The resistance Rab represents the equivalent resistance of all the connection wires used for the bond connecting the connection point B to the access terminal A. These wires being connected in parallel with one another, their equivalent resistance, denoted Rab, is equal to:

$$Rab = \frac{1}{\Sigma_n\left(\frac{1}{Rabn}\right)} = \frac{1}{\frac{1}{Rab1} + \frac{1}{Rab2} + \frac{1}{Rab3} + \cdots \frac{1}{Rabn}} \quad \text{(Eq. 2)}$$

where Rabn represents the resistance of a connection wire used to produce the corresponding bond.

In view of the formula above for the equivalent resistance Rab, we can by way of example deduce therefrom the equivalent resistance Rab for two connection wires used to produce the bond, in the following way:

$$Rab = \frac{1}{\frac{1}{Rab1} + \frac{1}{Rab2}} = \frac{Rab1 \times Rab2}{Rab1 + Rab2} \quad \text{(Eq. 3)}$$

Rab1 representing the resistance of the first connection wire,

Rab2 representing the resistance of the second connection wire.

If we assume that the value of the contact resistance of a connection wire is for example of the order of 20 mΩ, then the value of the resistance Rab corresponding to the equivalent resistance of the two connection wires connected in parallel will be equal to 10 mΩ.

In the event that one of the two connection wires used to make this bond breaks, the value of the resistance will be doubled and increased to 20 mΩ. The effect of this change in the value of Rab will be to alter the measured values of V (essentially) and of I (very slightly).

Once the value of the contact resistance has been obtained, either it may be stored in a register internal to the computation unit or in a component external to the computation unit, for subsequent processing, or it may be used in order to be compared with reference values of contact resistances. A plurality of strategies of comparison or monitoring of contact resistances may be envisioned.

Figure 7B:
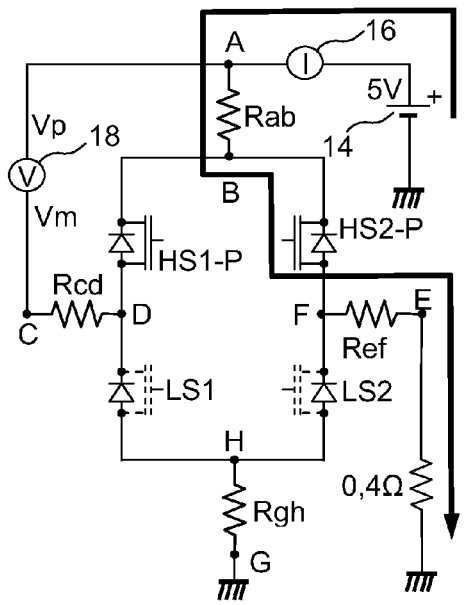

In FIG. 7b, for the measurement of Rab, the high-side transistors HS1 and HS2, of the P type and denoted HS1-P and HS2-P, cannot be controlled by a voltage as low as 1 V. The voltage delivered by the supply 14 is thus set at 5 V, and the current is limited by a 0.4Ω resistance between the terminal E and ground.

Figure 8A:
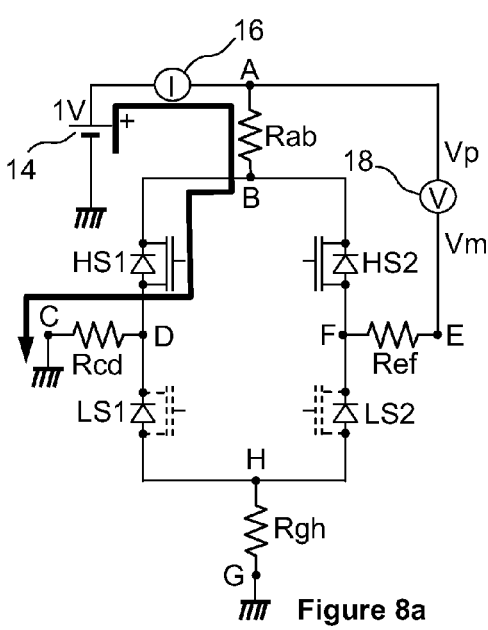
Figure 8B:
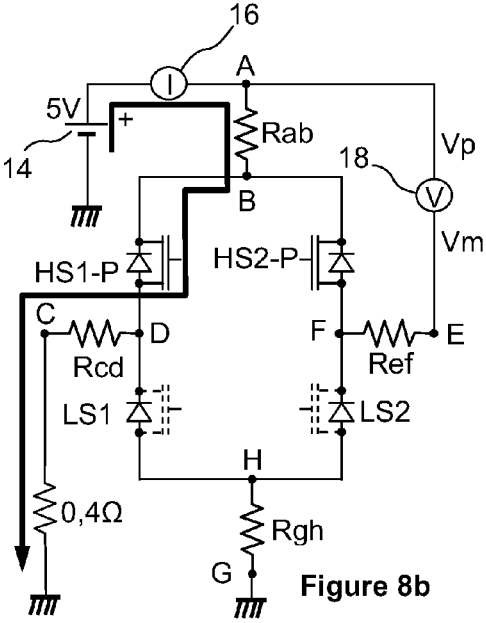

Another possible circuit configuration for measuring Rab is proposed in FIG. 8a (and in the table of FIG. 6).

In the configuration of FIG. 8a, in comparison with that of FIG. 7a, the changes in connectivity and connection do not affect the voltage supply, the stabilized supply 14 remaining connected to the access pin A as well as the ammeter 16.

It is proposed in FIG. 8a to measure the voltage between the access terminals A and E and to ground the other access terminal neighboring the access terminal A, that is to say the access terminal C. The person skilled in the art will immediately understand that this arrangement is equivalent to that of FIG. 7a, and makes it possible to determine the resistance Rab in an entirely similar way. Furthermore, slight modifications make it possible to convert from FIG. 7b to FIG. 8b by reversing the roles of the terminals C and E.

The second contact resistance to be characterized out of the four represented in FIG. 3 is the resistance Ref.

Figure 9A:
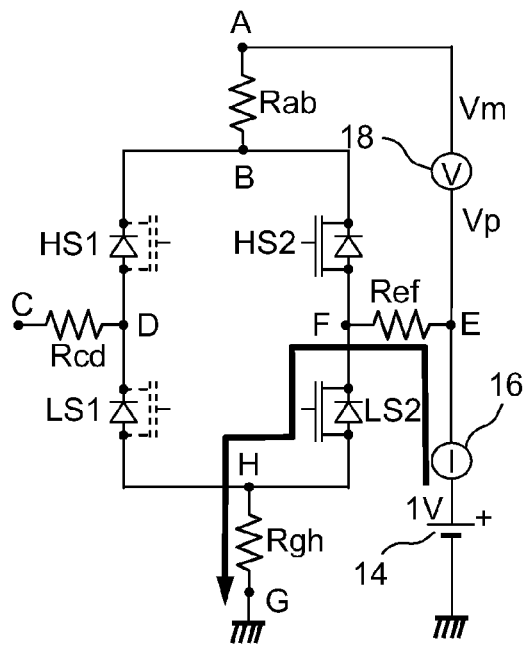

In order to do this, as represented in FIG. 9a, the stabilized supply 14 is connected to the access terminal E corresponding to this resistance Ref. The ammeter 16 is connected in series in order to determine the current I flowing through the resistance Ref.

It may be noted here that the access terminal G, which is an access terminal neighboring the access terminal E corresponding to the contact resistance which is intended to be characterized, is already by design connected to ground. Then, the voltmeter 18 is merely connected in order to determine the voltage between the access terminals E and A.

In order to determine the contact resistance Ref, it is proposed here that the transistors HS2 and LS2 (FIG. 9a) connected at the corresponding connection point to the contact resistance which is intended to be determined should be in the "ON" position, corresponding to a switched or conducting state. The transistors HS1 and LS1 are for their part in the "OFF" position, i.e. in an open position or blocked.

The potential applied by the stabilized supply as described above may, for example, be of the order of 1 V, and it will be applied to the terminal E as presented in FIG. 9a. The potential at point A is identical to the potential at point F because of the "ON" or conducting state of the transistor HS2. The electric current flowing through the circuit, and more especially the current flowing through the resistance to be characterized i.e. the resistance Ref, is measured by the ammeter 16. The potential difference V is measured between the terminals E (hot point) and A (cold point). The value of the resistance to be characterized is then equal to:

$$Ref = V/I \quad \text{(Eq. 4)}$$

Figure 9B:
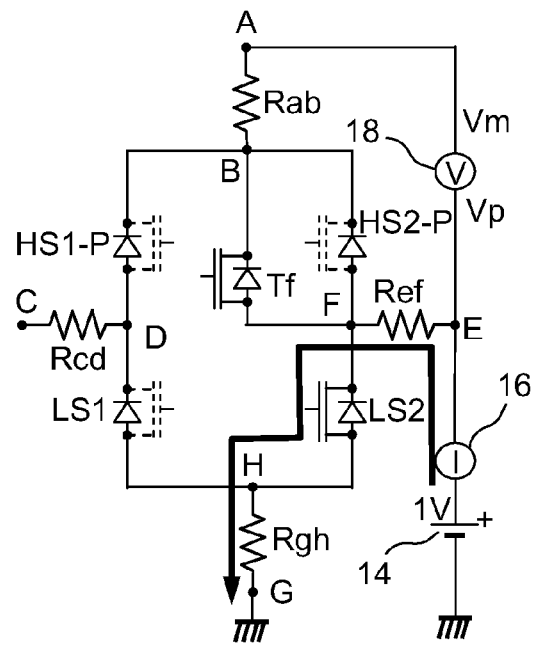
Figure 9C:
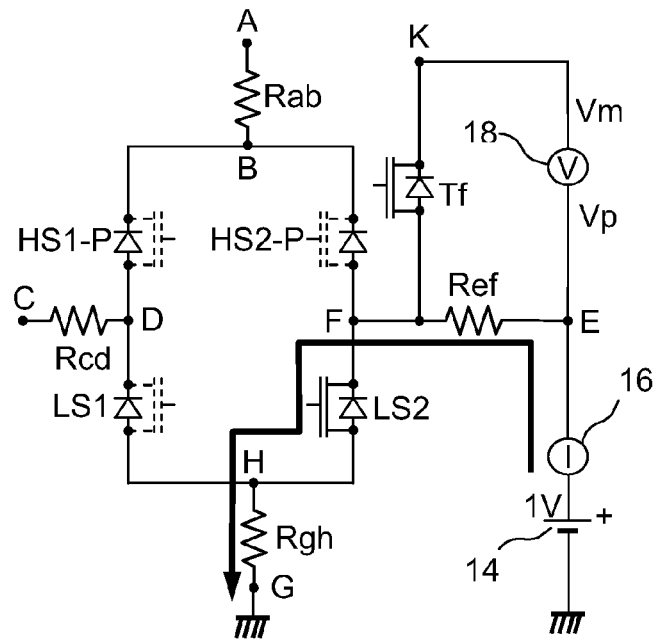

FIGS. 9b and 9c represent possibilities for measurement of the resistance Ref when the high-side transistors are of the P type. It is then necessary to employ an additional transistor Tf in order to bring the potential of F to a measurable point (A in FIG. 9b, or K in FIG. 9c). This transistor Tf is an N-type MOS of very small size, the resistance of which may reach a few ohms, which essentially does not affect the measurement.

The third bonding resistance out of the four represented in the diagram of FIG. 3 is the resistance Rcd.

In order to do this (FIG. 10a), the stabilized supply 14 is connected to the access terminal C corresponding to the contact resistance to be characterized. The ammeter 16 is connected in series with the resistance Rcd in order to measure the current flowing through the latter.

Likewise as for the determination of the value of the resistance Ref, it may be noted that an access terminal (the access terminal G) neighboring the access terminal C corresponding to the contact resistance which is intended to be determined is already connected to ground.

As before, in this case the voltage at the other access terminal neighboring the access terminal corresponding to the contact resistance which is intended to be determined is determined. The access terminal A is then connected to an input pin denoted Vm (cold point) of the voltmeter 18, as presented in FIG. 10a. The other terminal Vp of the voltmeter 18 is for its part connected to the terminal C.

In order to characterize the contact resistance Rcd, it is proposed for the transistors denoted HS1 and LS1 (FIG. 10a) to be in the "ON" position, a position corresponding to a switched or conducting state. The transistors HS2 and LS2 are for their part in the "OFF" position, that is to say in an open position or blocked (FIGS. 6 and 10a).

As already explained above for the resistances Rab and Ref, the value of the resistance to be characterized is then equal to:

$$Rcd = V/I \qquad \text{(Eq. 5)}$$

FIGS. 10b and 10c represent possibilities for measurement of the resistance Rcd when the high-side transistors are of the P type. An auxiliary transistor Td is then necessary in order to bring the potential of point B to point A (FIG. 10b) or to point K (FIG. 10c).

The fourth and last bonding resistance out of the four represented in the diagram of FIG. 3 is the resistance Rgh.

It is proposed here (FIGS. 6 and 11) to connect the stabilized supply 14 to the access terminal C and to measure the current in the corresponding resistance Rcd with the aid of the ammeter 16.

The access terminal G is already connected to ground.

The voltmeter 18 is used here to measure the voltage between the access terminal E and the access terminal G, i.e. ground.

The transistors denoted LS1 and LS2 (FIG. 11) are in the "ON" position, a position corresponding to a switched or conducting state. The transistors HS1 and HS2 are for their part in the "OFF" position, i.e. in an open position or blocked.

The current flowing through the contact resistance Rcd also corresponds to the current flowing through the contact resistance Rgh which is intended to be determined. Furthermore, the potential at point E is (very substantially) identical to the potential of the connection point H, if the voltage drop across the terminals of the transistor LS2 is neglected. The potential difference across the terminals of Rgh, on the one hand, and the current flowing through this resistance, on the other hand, are therefore known. The resistance Rgh can therefore be determined.

Figures 11, 12:
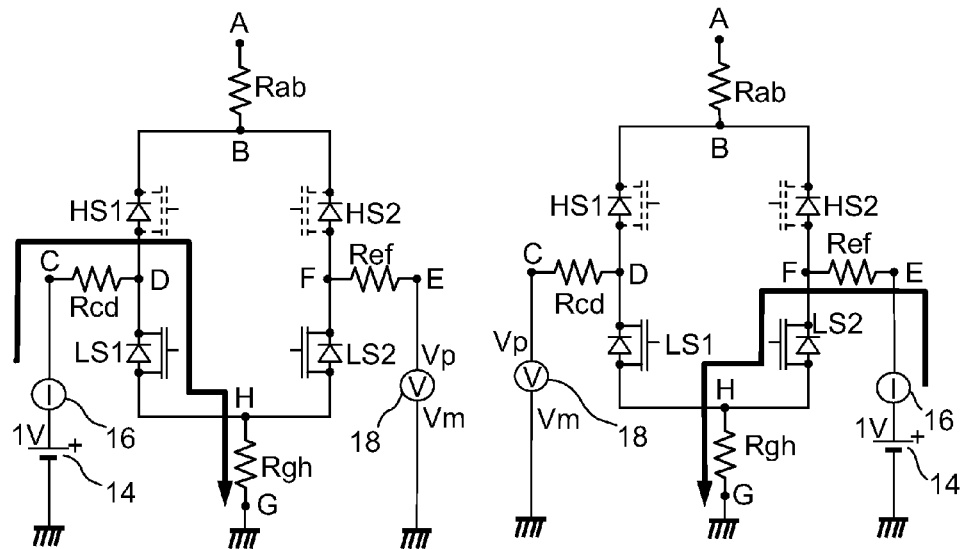

By symmetry of the H bridge, as suggested in FIG. 6, in order to determine Rgh it is also possible to connect the ammeter 16 and the stabilized supply 14 to the access terminal E and measure the electrical potential of the access terminal C with the aid of the voltmeter 18, which is proposed by FIG. 12.

Using two other sets of combinations and two other specific connectivities, it is possible to measure simultaneously the pairs of resistances [Ref; Rgh] and [Rcd; Rgh]. The use of an additional voltage measuring instrument 19 is proposed in order to carry out the characterization of this pair of resistances.

Figures 13, 14:
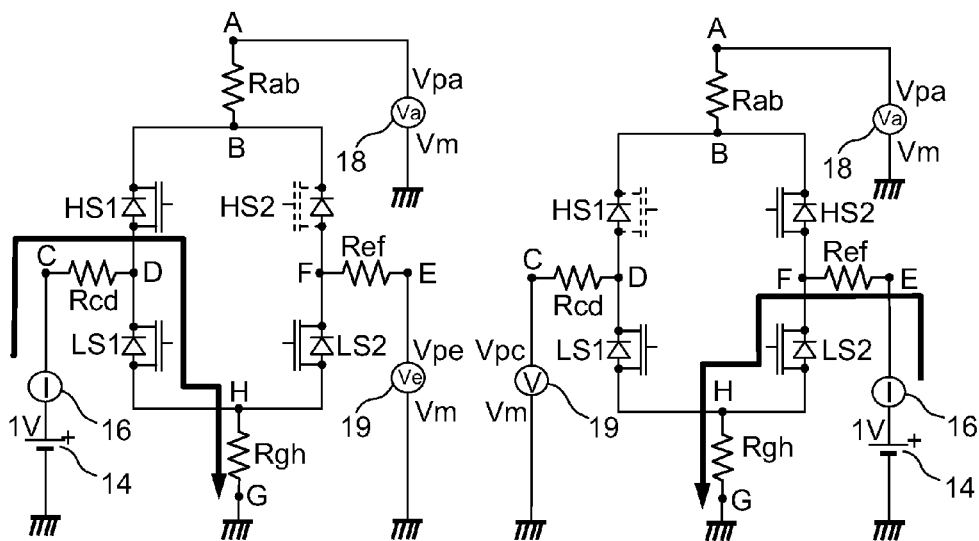

FIGS. 13 and 14 present the positions of the various measuring and supply instruments used for the measurement of these pairs of resistances, and also a control set for the power MOS transistors. This technique will make it possible to measure two bonding resistances simultaneously.

It will be understood that the invention is not limited to the embodiment of the power switches (MOS transistors), which is only a nonlimiting illustrative example.

The description above is given solely by way of illustration, and it does not limit the scope of the invention. Any alternative embodiment within the capacity of the person skilled in the art on the basis of the description above may be envisioned within the scope of the present invention.

Likewise, the numerical values are not limited to the examples given here purely by way of illustration, and may be any other values on the basis of the embodiment system.

Lastly, it is possible for the invention to be applied to the control of any inductive load, not only that of an electric motor. It may, for example, be an electromagnetic actuator with a fixed coil and moving core (or vice versa).

The invention claimed is:

1. A method for determining an internal contact resistance of an H bridge comprising four transistors arranged in an H, each transistor having a point of connection to two neighboring transistors, a bond being produced in each case between a connection point lying between two transistors and an access terminal, the method comprising:
    acting on the open/closed state of the transistors of the H bridge so that the transistors on either side of the connection point corresponding to the access terminal are open;
    applying a determined voltage to the access terminal;
    determining the current flowing through the bond corresponding to said access terminal;
    grounding an access terminal neighboring said access terminal when the neighboring access terminal is not already connected to ground; and
    measuring the voltage at the other neighboring access terminal.

2. The method as claimed in claim 1, wherein the voltage applied to the access terminal is less than the control voltage of each of the transistors.

3. The method as claimed in claim 1, wherein the voltage applied to the access terminal is between 0.5 V and 5 V.

4. The method as claimed in claim 2, wherein the voltage applied to the access terminal is between 0.5 V and 5 V.

* * * * *